United States Patent [19]

Hafner

[11] Patent Number: 4,675,550
[45] Date of Patent: Jun. 23, 1987

[54] MODE DETECTION CIRCUIT FOR A DUAL PURPOSE ANALOG INPUT

[75] Inventor: Warren G. Hafner, Lake Carmel, N.Y.

[73] Assignee: Pitney Bowes Inc., Stamford, Conn.

[21] Appl. No.: 710,793

[22] Filed: Mar. 12, 1985

[51] Int. Cl.$^4$ ............................................. H03K 5/24
[52] U.S. Cl. ................................. 307/350; 307/290; 307/362; 307/363
[58] Field of Search ............... 307/290, 350, 362, 363

[56] References Cited

U.S. PATENT DOCUMENTS

| | | | |
|---|---|---|---|
| 3,474,264 | 10/1969 | Hughes | 307/290 |
| 3,898,484 | 8/1975 | Wilcox | 307/350 |
| 4,038,605 | 7/1977 | Elder et al. | 307/362 |

*Primary Examiner*—John Zazworsky
*Attorney, Agent, or Firm*—Michael J. DeSha; David E. Pitchenik; Melvin J. Scolnick

[57] ABSTRACT

A mode detection circuit is disclosed that provides a high or low digital output signal to an associated circuit analog dependent upon the corresponding input signal. The input signal to the mode detection circuit will determine whether the mode of the input signal and associated circuit is to be external or internal. In this embodiment, the input of the mode detection circuit receives either a first voltage in the internal or a second voltage in the external mode which is lower than the first voltage. Thus, when the input voltage to the circuit is the first voltage, there is provided at the output a digital output that is high. In this embodiment, a high digital output signal would mean that the associated circuit with the detection circuit would be in the internal mode. On the other hand, when the analog input signal is the second voltage, there would be provided at the output of the detection circuit a low digital output signal which would mean that the associated circuit would be in the external mode. Accordingly, this circuit utilizes digital detect logic to which network (i.e. external or internal) of the associated circuit is to be utilized depending upon the voltage level which is provided at the input of the mode detection circuit.

4 Claims, 1 Drawing Figure

MODE DETECTION CIRCUIT FOR A DUAL PURPOSE ANALOG INPUT

FIELD OF THE INVENTION

The present invention relates to voltage monitoring circuits, and more specifically to a mode selection circuit for a dual purpose analog input.

BACKGROUND OF THE INVENTION

In various electronic systems employing microprocessors and integrated circuits it is desirable to eliminate the need to provide separate input pins for each analog input. Electronic systems such as the above-mentioned can be provided with an analog input from an internal resistor network or an external resistor network.

Thus, often times it is important that there be some means for monitoring that analog input to determine whether the electronic system is working from an internal or external mode. It is known that in many electronic systems, the internal mode may be a one voltage level, i.e., ten volts, but can then be divided down to a lower voltage to be used within the electronic system. It is also known that often times the signal from an external mode resistor network may have already been divided down externally and be provided to the input of the electronic system as a lower voltage, i.e., five volts.

Thus, accordingly what is needed is a circuitry that will be able to detect effectively and efficiently which mode the electronic system is in and provide the signal to indicate to the analog input of the electronic system that a certain mode has been detected. This circuitry should also be able to provide an indication via a digital output that the electronic system employed is in the external or internal mode.

SUMMARY OF THE INVENTION

It is an object of the present invention to provide a mode detection circuit which eliminates the need to provide separate input pins in an integrated circuit.

It is a further object of the present invention to provide a mode detection circuit for selecting inputs from an internal resistor network or an external resistor network.

It is a still further object of the present invention to provide a mode detection circuit including MOSFETs in which an analog input voltage is isolated from the source and drain terminals of the MOSFETs.

It is a still further object of the present invention to provide a mode detection circuit which is reliable and economical to implement.

Briefly, in accordance with the present invention, a mode detection circuit and associated method is provided for a dual purpose analog input, comprising a reference terminal for receiving a reference voltage, an input terminal for receiving input voltages, a mode terminal for providing an output voltage, first switch means electrically coupled to the input terminal for establishing a threshold voltage, first voltage divider means electrically coupling the reference terminal to the first switch means, second switch means electrically coupled to the mode terminal, second voltage divider means electrically coupling the input terminal to the second switch means for dividing down the input voltage applied to the first switch means in response to activation of the second switch means, the mode terminal providing a first voltage mode when the input voltage to the input terminal relative to the divided voltage from the first voltage divider is in a first condition relative to the threshold voltage of the first switch means and a second voltage mode when the input voltage to the input terminal divided by the second voltage divider means relative to the divided voltage from the first voltage divider is in a second condition relative to the threshold voltage of the first switch means.

Other objects, aspects and advantages of the present invention should be understood from the detailed description considered in conjunction with the drawing, as follows.

BRIEF DESCRIPTION OF THE DRAWING

The drawing is a schematic circuit diagram of a mode detection circuit in accordance with the present invention.

DETAILED DESCRIPTION

Figure 1:
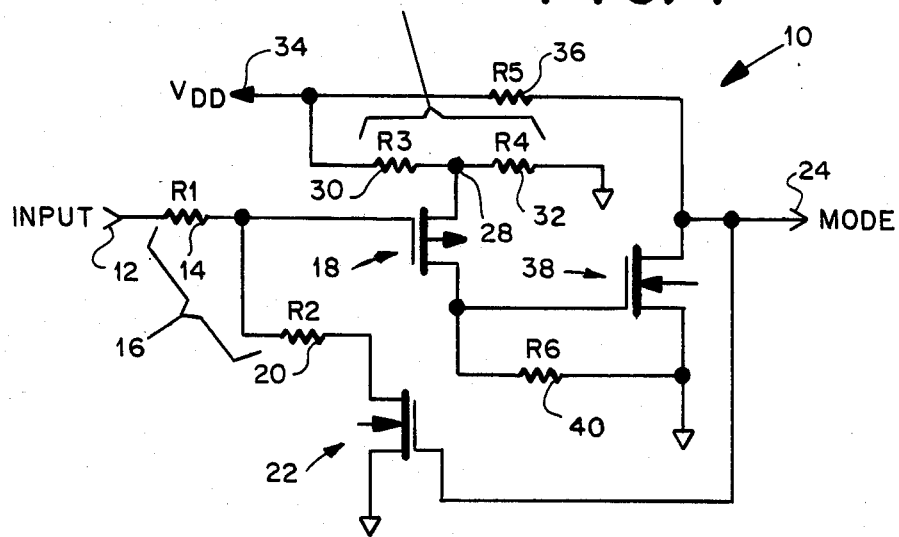

Referring to the drawing, a mode detection circuit in accordance with the present invention is indicated generally at 10. The mode detection circuit 10 includes an input terminal 12 for receiving an analog input voltage. The analog input voltage may be obtained from an external voltage source to be divided by an internal resistor network or from an external resistor network, as desired.

A first resistor 14, which forms part of a voltage divider network 16, couples the input terminal 12 to the gate terminal of a field effect transistor in the form of a P-channel MOSFET 18. The voltage divider network 16 includes a second resistor 20 electrically coupled to the gate terminal of the P-channel MOSFET 18 and to the drain terminal of a field effect transistor in the form of an N-channel MOSFET 22. The source terminal of the MOSFET 22 is grounded and the gate terminal is coupled to a mode output terminal 24.

The source terminal of the P-channel MOSFET 18 is electrically coupled to another voltage divider network 26, specifically at point 28 between electrically coupled resistors 30 and 32. The other end of resistor 32 is grounded and the other end of resistor 30 is electrically coupled to a reference terminal 34 which receives the reference voltage $V_{DD}$, which may be, e.g., the chip supply voltage.

The reference terminal 34 is coupled to the mode output terminal 24 through a current limiting resistor 36. The mode output terminal 24 is also electrically coupled to the drain terminal of a field effect transistor in the form of an N-channel MOSFET 38. The gate terminal of the N-channel MOSFET 38 is coupled to the drain terminal of the P-channel MOSFET 18 and the source terminal of the N-channel MOSFET 38 is grounded and coupled to the drain terminal of the P-channel MOSFET 18 through a biasing resistor 40.

In operation, when the analog input voltage present at input terminal 12 is less than the voltage $V_{DD}$ divided by the voltage divider network 26 (R3/R3+R4) minus the threshold voltage of P-channel MOSFET 18, the P-channel MOSFET 18 conducts, applying a positive voltage to the gate terminal of the N-channel MOSFET 38 and causing it to turn on. With the MOSFET 38 on, the mode output terminal 24 is pulled toward ground by the MOSFET 38 which also holds MOSFET 22 in an off condition. Thus, for a "low" analog input voltage, which is less than the voltage $V_{DD}$ divided by the voltage divider network 26 minus the threshold voltage of the P-channel MOSFET 18, the output mode terminal 24 is held low.

As the input voltage at input pin 12 increases, the difference between the voltage present at the gate terminal and the divided voltage present at the source terminal of the MOSFET 18 is less than the threshold voltage of the MOSFET 18 causing it to turn off. With the MOSFET 18 off, the positive voltage is removed from the gate terminal of the N-channel MOSFET 38, causing it to turn off. As a result of the current through the current limiting resistor 36, the output present at the mode output terminal 24 will begin to turn "high." As a result, MOSFET 22 is turned on due to the presence of a positive voltage at its gate terminal, pulling the resistor 20 toward ground and causing the input voltage at input terminal 12 to be divided down by the voltage divider network 16. Thus, MOSFET 18 will remain off and the output mode will remain high if the input voltage divided down by the voltage divider network 16 minus the threshold voltage of the MOSFET 18 is greater than the reference voltage $V_{DD}$ divided by the voltage divider network 26. Thus, the known analog input voltage level differences are effectively compared to a divided down $V_{DD}$ to provide the proper output mode, and provides capability for the circuit to be operational with an input voltage higher than the chip supply voltage, $V_{DD}$.

Thus, this description describes a mode detection circuit which uses a single dual purpose analog input terminal which will automatically determine which of a plurality of operational modes is to be configured by detecting the voltage level applied to the input terminal. The detection circuit also provides a voltage division on an input voltage greater than that which could be provided at the substrate which would help prevent any circuit damage and also allow for normal operation of the circuitry when this higher voltage is applied. The detection circuit provides means for varying the mode detection threshold voltage so that this circuitry could be used in a variety of applications. The mode detection circuit also provides a digital output signal that can be utilized by the external circuitry required to change the mode to indicate which mode should be configured. Finally, the use of this mode detection output of this circuit can be used to determine whether or not to divide the input voltage down to a lower voltage for use in the dependent circuitry. This circuitry can advantageously utilize integrated circuit technology.

It should be understood by those skilled in the art that various modifications may be made in the present invention without departing from the spirit and scope thereof as described in the specification and defined in the appended claims.

What is claimed is:

1. A mode detection circuit having a dual-purpose input terminal, the circuit comprising:
   a reference terminal for receiving a reference voltage;
   an input terminal for receiving input voltages;
   a mode terminal for providing an output voltage;
   first switch means electrically coupled to said input terminal for establishing a threshold voltage;
   first voltage divider means electrically coupling said reference terminal to said first switch means;
   second switch means electrically coupled to said mode terminal;
   second voltage divider means electrically coupling said input terminal to said second switch means for dividing down the input voltage applied to said first switch means in response to activation of said second switch means;
   said mode terminal providing a first voltage when the input voltage to the input terminal relative to the voltage supplied from said first voltage divider means is in a first voltage range relative to the threshold voltage and a second voltage when the input voltage to the input terminal divided by said second voltage divider means relative to the divided voltage from said first voltage divider is in a second voltage range relative to the threshold voltage of said first switch means;
   a current limiting resistor coupling said reference terminal to said mode terminal;
   said first switch means includes first field effect transistor means and second field effect transistor means having the drain terminal of said first field effect transistor means coulped to the source terminal of said second field effect transistor means through a biasing resistor and the drain terminal of said first field effect transistor means coupled to the gate terminal of said second field effect transistor means.

2. The mode detection circuit recited in claim 1, wherein:
   said second switch means includes third field effect transistor means having its drain terminal coupled to said second voltage driver means and its gate terminal coupled to said mode terminal.

3. The mode detection circuit recited in claim 2, wherein:
   said first, second and third field effect transistor means are MOSFETs.

4. A mode detection circuit having a dual-purpose input terminal, the circuit comprising:
   a reference terminal for receiving a reference voltage;
   an input terminal for receiving input voltages;
   a mode terminal for providing an output voltage;
   first switch means electrically coupled to said input terminal for establishing a threshold voltage;
   first voltage divider means electrically coupling said reference terminal to said first switch means;
   second switch means electrically coupled to said mode terminal;
   second voltage divider means electrically coupling said output terminal to said second switch means for dividing down the input voltage applied to said first switch means in response to activation of said second switch means;
   said mode terminal providing a first voltage when the input voltage to the input terminal relative to the voltage supplied from said first voltage divider means is in a first voltage range relative to the threshold voltage and a second voltage when the input voltage to the input terminal divided by said second voltage divider means relative to the divided voltage from said first voltage divider is in a second voltage range relative to the threshold of said first switch means;
   said first switch means includes a first field effect transistor means and a second field effect transistor means;
   said second switch means includes third field effect transistor means; and
   said first field effect transistor means has its source terminal coupled to said first voltage divider means, its gate terminal coupled to said second voltage divider means and its drain terminal coupled to the source terminal of said second field effect transistor means through a biasing resistor and to the gate terminal of said second field effect transistor means;

said second field effect transistor means has its source terminal grounded and its drain terminal coupled to said reference terminal through a current limiting resistor and to said mode terminal; p1 said third field effect transistor means has its drain terminal coupled to said second voltage divider means, its source terminal grounded and its gate terminal coupled to said mode terminal.

* * * * *

UNITED STATES PATENT AND TRADEMARK OFFICE
CERTIFICATE OF CORRECTION

PATENT NO. : 4,675,550
DATED : June 23, 1987
INVENTOR(S) : Warren G. Hafner

It is certified that error appears in the above—identified patent and that said Letters Patent is hereby corrected as shown below:

Column 4, line 28 "driver" should be --divider--.

Column 6, line 1, delete "P1".

Signed and Sealed this

Ninth Day of August, 1988

*Attest:*

DONALD J. QUIGG

*Attesting Officer*  *Commissioner of Patents and Trademarks*